United States Patent [19]

Dixon et al.

[11] Patent Number: 4,632,058
[45] Date of Patent: Dec. 30, 1986

[54] APPARATUS FOR UNIFORM CHEMICAL VAPOR DEPOSITION

[75] Inventors: Robert E. Dixon; James McDiarmid, both of San Jose, Calif.

[73] Assignee: Gemini Research, Inc., Fremont, Calif.

[21] Appl. No.: 584,073

[22] Filed: Feb. 27, 1984

[51] Int. Cl.⁴ .............................................. C23C 16/24
[52] U.S. Cl. .................................... 118/725; 118/730; 156/613; 156/DIG. 64
[58] Field of Search ............... 156/610, 613, DIG. 64; 422/245; 118/50.1, 715, 725, 730

[56] References Cited

U.S. PATENT DOCUMENTS

| | | | |
|---|---|---|---|
| 3,717,439 | 2/1973 | Sakai | 118/715 |
| 3,845,738 | 11/1974 | Burkman et al. | 156/613 |
| 4,430,959 | 2/1984 | Ebata et al. | 118/725 |

Primary Examiner—David L. Lacey
Attorney, Agent, or Firm—Townsend & Townsend

[57] ABSTRACT

A vertical reactor for chemical vapor deposition having an $H_1/D_1$ ratio in the range of 1.10 to 1.40, where $H_1$ is the height of the reactor bell jar enclosure above the susceptor and $D_1$ is the diameter of the susceptor. Reactor performance is further improved by extending the outermost coil of the induction coil heating the susceptor beyond the outer diameter of the susceptor and by extending the innermost coil of the induction coil within the inner diameter of the susceptor.

14 Claims, 3 Drawing Figures

U.S. Patent Dec. 30, 1986 4,632,058
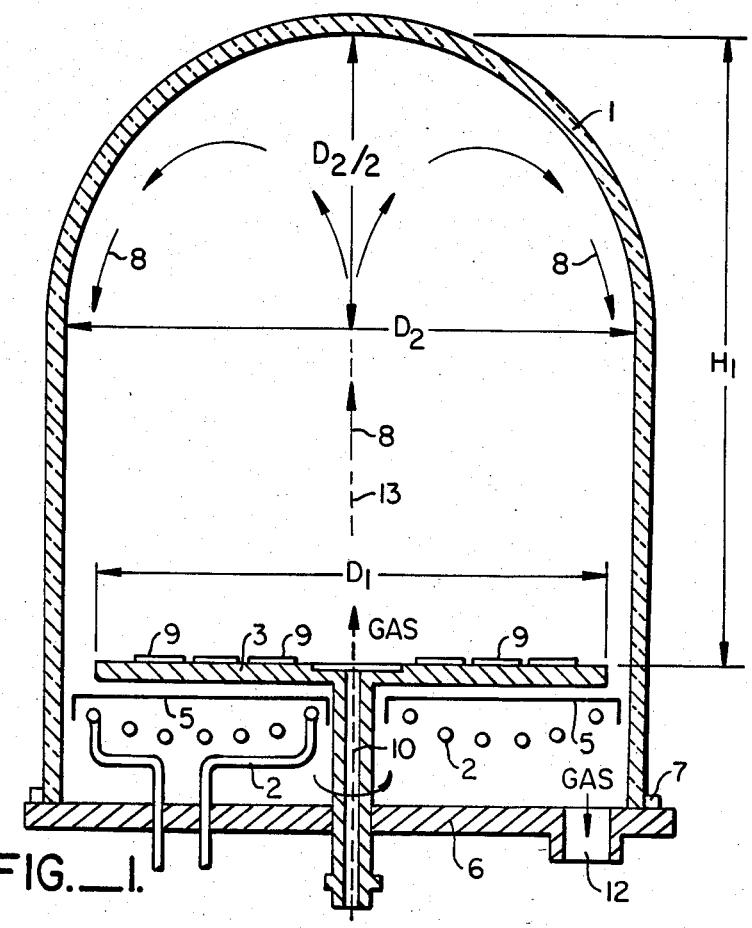
FIG._1.
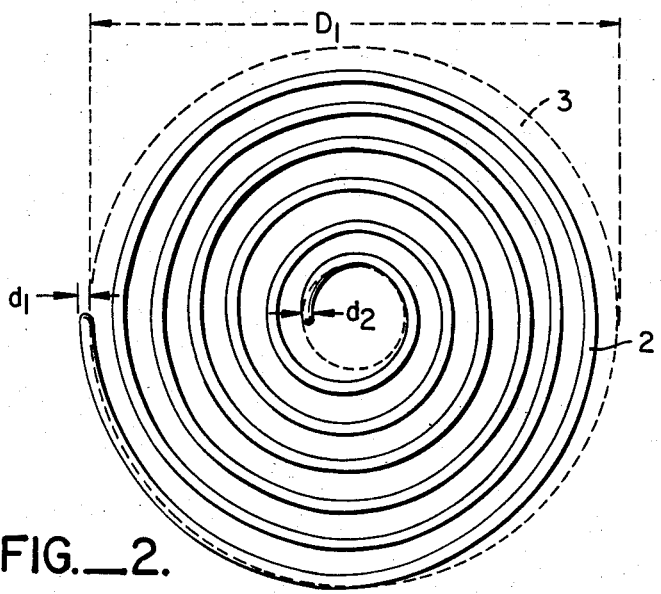
FIG._2.

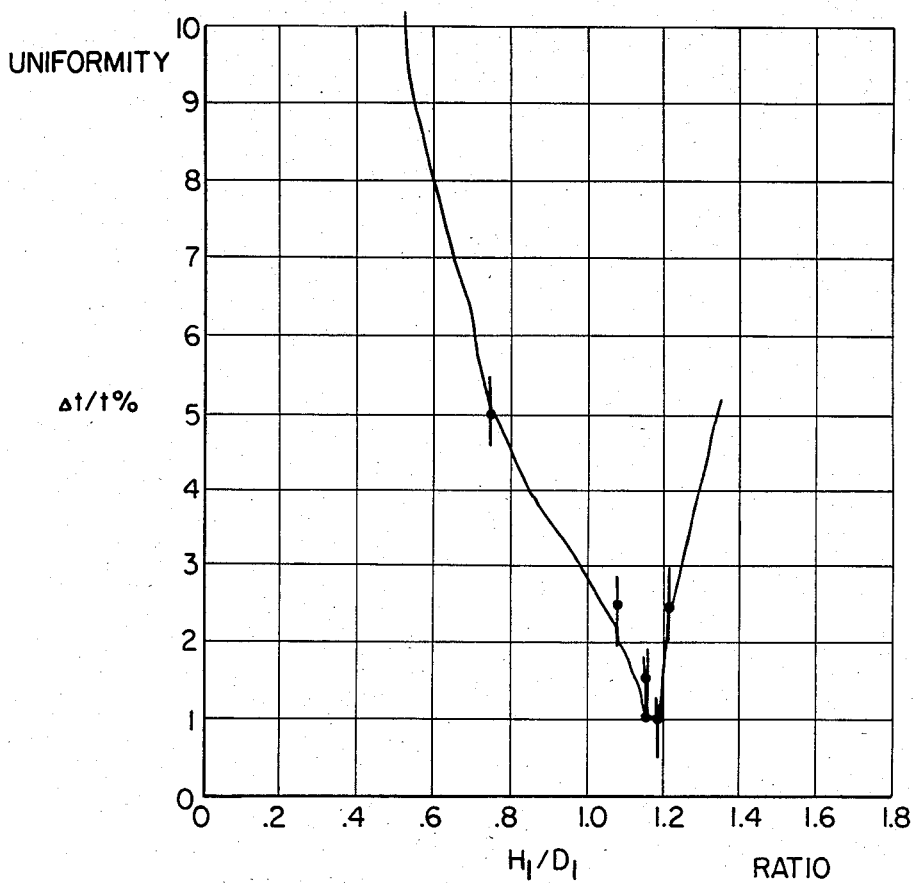
FIG._3.

APPARATUS FOR UNIFORM CHEMICAL VAPOR DEPOSITION

FIELD OF THE INVENTION

The present invention relates to an apparatus and method for depositing a uniform layer of material upon a substrate and, more particularly, to vertical reactors for the chemical vapor deposition of silicon upon a semiconductor substrate.

BACKGROUND OF THE INVENTION

In semiconductor processing technology, a desired goal is the uniformity of process results. One of these process steps is the deposition of material upon semiconductor substrates from gases. This is called chemical vapor deposition. Semiconductor substrates are placed into a reactor on a carrier or susceptor, which is then heated by induction and/or high intensity light radiation to high temperatures, typically 1000° C.–1300° C. Gases are passed through the reactor and the deposition process occurs by a chemical reaction in the gases. The reacting gases deposit material on the substrates.

One of these chemical vapor deposition processes, epitaxial silicon deposition, is the formation of a single crystal film on top of a single crystal substrate. Satisfactory epitaxial silicon deposition requires control of crystal surface defects, undesired impurities, and uniformity of both thickness and doping concentration of the epitaxial silicon. The doping concentration in the epitaxial layer determines the resistivity or conductivity of the layer. Variations in the thickness of the deposited epitaxial layer may occur on substrates at different locations on the carrier or susceptor and even on a single substrate. The uniformity of the epitaxial layer is controlled by the specific combination of the mainstream gas flow rate, the specific geometry of the reactor enclosure, including the shape and location of the gas inlet, and the temperature uniformity of the susceptor.

On the other hand, the average resistivity is controlled by the average dopant concentration in the gas stream and the average temperature. Since the incorporation of dopants into the epitaxial layer is more strongly related to the local temperature of a susceptor region and the overlying substrate than the local growth rate of the epitaxial silicon on the overlying substrate, localized variations in temperature have a larger effect upon resistivity rather than thickness. The result is that resistivity uniformity is primarily controlled by the local temperature values.

In a semiconductor manufacturing operation, the epitaxial layer thickness is typically controlled by optimizing all the variables noted above. The nonuniform temperature profiles are compensated for by making mechanical and flow rate adjustments. Sometimes nonuniform temperature variations are purposely introduced to achieve uniform deposition thickness, which compromises the resulting resistivity uniformity. Heretofore, there has been difficulty in achieving uniform resistivity and thickness simultaneously.

Two main classes of reactors are used for chemical vapor deposition, the "hot wall" reactor and the "cold wall" reactor. In a hot wall reactor, all parts of the reactor are heated so that the reactor walls are at the same temperature as the susceptor or carrier, which bears the semiconductor substrates. In a cold wall reactor, the energy for heating the system is directed toward the susceptor or carrier. The reactor walls are thus cooler than the susceptor or carrier.

In the class of cold wall reactors, there are three types of reactors—the vertical reactor, the horizontal slab reactor and the cylinder reactor. The present invention relates to the first of these reactor types.

With the problems above, it has been widely believed that the vertical reactor, which has been in commercial existence for more than fifteen years, is capable of no better than a ±5%–10% thickness uniformity and a ±8%–15% resistivity uniformity for silicon epitaxial deposition.

SUMMARY OF THE INVENTION

To solve or substantially mitigate the problems of thickness uniformity and resistivity uniformity in chemical vapor deposition, the present invention provides for a bell jar enclosure for a chemical vapor deposition reactor having a susceptor arranged perpendicularly to a center line of the bell jar enclosure, the bell jar enclosure having a $H_1/D_1$ ratio in the range of 1.10 to 1.40, where $H_1$ is the height of the enclosure above the susceptor and $D_1$ is the diameter of the susceptor.

More particularly, the present invention provides for a bell jar enclosure having an $H_1/D_1$ ratio in the range of 1.15 to 1.20 for the chemical vapor deposition of epitaxial silicon at a rate of 0.5 to 1.5 microns per minute. For a faster deposition rate of 1.5 to 3.0 microns per minute, the present invention provides for an enclosure having an $H_1/D_1$ ratio in the range 1.20 to 1.30, and for an even faster deposition rate of 3.0 to 4.0 microns per minute, the present invention provides for an enclosure having an $H_1/D_1$ ratio in the range of 1.30 to 1.37.

Furthermore, the present invention has a susceptor with an inner and outer diameter. Located in close proximity to the susceptor is a spiral induction heating coil, consisting of multiple turns. The innermost turn extends beyond the inner diameter of the susceptor by 0.15 to 0.25 inches and the outermost turn extends beyond the outer diameter of the susceptor by 0.05 to 0.25 inches. This arrangement provides for the uniform heating of the susceptor.

The present invention also provides for a method of depositing epitaxial silicon by chemical vapor deposition upon substrates in a vertical reactor comprising: determining the rate of deposition of the epitaxial silicon, and selecting a reactor enclosure having an $H_1/D_1$ in the range of 1.10 to 1.40 to obtain high uniformity in the epitaxial silicon thickness.

BRIEF DESCRIPTION OF THE DRAWINGS

An understanding of the present invention may be obtained by a perusal of the following detailed description with reference to the following drawings:

FIG. 1 is a vertical cross-section of the reactor of the present invention.

FIG. 2 is a top view of the susceptor and the closely located heating coil for the reactor in FIG. 1.

FIG. 3 is a graph showing the effects of the reactor geometry upon the uniformity of the deposited epitaxial layer.

DETAILED DESCRIPTION OF SPECIFIC EMBODIMENTS

A vertical reactor is shown in FIG. 1. A bell jar enclosure 1 is sealed to a base plate 6 by a remakeable seal 7. A horizontal susceptor 3 bearing substrates 9 rotates about the center axis 13 of the complete enclosure 1 and 6. The susceptor 3 is heated by a spiral induction coil 2. The induction coil 2 is separated from the susceptor 3 by a coil cover 5, which, with the bell jar enclosure 1, defines the gas reaction volume for the reactor. Reactant gases with a carrier gas are introduced through an inlet tube 10 located along the center axis 13 of the enclosure 1. The tube 10, whose height is adjustable, is shown here flush with the inner portion of the susceptor 3. The entering gases are driven about the complete enclosure 1, 6 by a convection current illustrated by the arrows 8. The convection current is driven by the difference in the higher susceptor temperature and the lower bell jar enclosure temperature. The gases are removed by one or possibly more exhaust ports 12 which are located in the base plate 6 near the wall of the enclosure 1. Other parts of the reactor, such as the power supplies, gas controls, pump and electronic controls, etc., are not shown in FIG. 1.

The bell jar enclosure 1 is partially defined by a right cylinder. In FIG. 1 the diameter of the cylinder is indicated by $D_2$. The enclosure 1 is capped by a half-sphere which has a radius $D_2/2$. Also shown in FIG. 1 is $H_1$, which is the height of the bell jar enclosure 1 above the susceptor 3. $D_1$ is the outer diameter of the susceptor 3. In all vertical reactors, including the present invention, the ratio of the susceptor outer diameter $D_1$ to the bell jar diameter $D_2$, or $D_1/D_2$, is in the range of 0.85 to 0.95.

Moreover, for vertical reactors in the prior art, the ratio of the bell jar enclosure height above the susceptor 3 to the susceptor outer diameter, or the ratio $H_1/D_1$, has been below 1.0. The reason for this is that in a deposition process, the fresh gas to be reacted is mixed with the partially reacted gas above the susceptor 3. The gas composition changes approximately following an exponential decay relationship based on a number of process enclosure volume changes. Rapid changes in chemistry require rapid gas volume changes. The larger the bell jar enclosure, the higher the required gas flow to achieve a required number of volume changes. This relationship of the bell jar volume change to the required gas flow rate, in combination with the higher cost for a larger bell jar, has led to vertical reactor designs using relatively small bell jars to achieve process control.

These prior art reactors require precise adjustment to process parameters, such as the gas flow, the height of the inlet tube 10 above the susceptor 3, the shape of the inlet tube 10, the nature and size of the gap between the susceptor 3 and the wall of the bell jar enclosure 1, and the size of the exhaust port 12 relative to the flow rate. For example, a common practice with prior art reactors is the use of so-called "magic wands," gas flow nozzles for attachment to the inlet tube 10 to control the inlet gas flow patterns. Wands in the shape of ball nozzles, T-bar nozzles, and inverted funnel nozzles exemplify the requirement of constant adjustment with prior art reactors. Another typical practice is the purposeful introduction of nonuniform heating of the susceptor 3 to optimize uniform deposition. An undesired result, though, is that while the deposited epitaxial layer is made more uniform in thickness, variations in the resistivity of the layer are introduced. This uniformity in resistivity is compromised for uniformity in thickness. Nonetheless, in spite of these efforts, results no better than a $\pm 5\%-10\%$ thickness uniformity and a $\pm 8\%-15\%$ resistivity uniformity have been attainable along any radius of the susceptor 3.

Even a prior art design of the assignee of the present invention, while achieving somewhat better results than stated above, has not approached the performance of the present invention. This prior art design has an $H_1/D_1$ ratio of 1.08, the only known prior art design to exceed 1.0. After precise adjustment of the process parameters, as discussed above, uniformity of 3% to 4% have been reached.

The present invention recognizes the effect of the geometry of the bell jar enclosure to an extent not appreciated in the prior art. The geometry of the enclosure 1 affects the shape of the gas flow. This is particularly important since epitaxial silicon is typically deposited at a high temperature so that the surface reaction rate exceeds the rate of arrival of reactants. Thus, the arrival rate of the gas molecules at the heated semiconductor substrates determines the deposition rate on the substrates. Therefore, the uniformity of gas flow to the surfaces of the substrates assures the desired uniformity of the deposited layer.

The present invention permits epitaxial silicon deposition uniformity heretofore not found. In a preferred embodiment of the invention, the ratio of the bell jar enclosure height to the susceptor diameter, $H_1/D_1$, is set in the range of 1.10 to 1.40.

FIG. 3 illustrates the effect of the enclosure geometry upon the uniformity of the deposited epitaxial silicon layer. The thickness uniformity is defined as $\pm \Delta t/t$ %=½ times the maximum value minus the minimum value over the average value of the epitaxial layer deposited on processed substrates multiplied by 100. The ratio of $H_1/D_1$ is varied. The process is a typical epitaxial silicon deposition process. Silicon tetrachloride, $SiCl_4$, is used with the substrates heated to a temperature of nominally 1150° C. with a temperature variation of less than $\pm 5°$ C. The gas flow is adjusted for deposition rate of 0.5–0.9 microns per minute. As shown in FIG. 3, there is a fairly sharp minimum in the thickness variation for a ratio of $H_1/D_1$ in the range of 1.16–1.18. Similar results are obtained for other typical epitaxial silicon deposition processes such as silane, $SiH_4$, at 1040° C. at a deposition rate of 0.1–0.3 microns per minute; dichlorosilane, $SiH_2Cl_2$, at 1100° C. for a deposition rate of 0.6 to 1.0 microns per minute; and trichlorosilane, $SiHCl_3$, at 1150° C. for a deposition rate of 0.8–1.5 microns per minute.

It has been found that the $H_1/D_1$ ratio for minimum thickness variation is a slowly changing function of the growth rate, moving from values of 1.15–1.20, or more specifically, 1.16–1.18, for deposition rates of 0.5–1.5 microns per minute, through a range of 1.20–1.30 for deposition rates of 1.5–3.0 microns per minute, to 1.30–1.37 for deposition rates of 3–4 microns per minute.

It has been found also that in these ranges of the enclosure height $H_1$ to the susceptor diameter $D_1$ and growth rate of the epitaxial silicon, the thickness uniformity is relatively independent of the total gas flow rate and only slightly dependent upon the inlet tube geometry. In the $H_1/D_1$ ratio range of 1.10–1.40, and for $D_1$ approximately 26 inches, thickness uniformity is essentially unchanged over a mainstream gas flow rate range of approximately 50 to 150 standard liters per minute. As a point of reference, variations of only 10 standard liters per minute in the mainstream gas flow have significant effects upon thickness uniformity in prior art reactors. In the present invention, a simple cylindrical inlet nozzle with a slight flare and located nearly flush with the top of the susceptor 3 is capable of providing ±0.5%–1.0% thickness uniformity at a 0.5–1.0 micron per minute deposition rate using silicon tetrachloride at 1150° C. with a $H_1/D_1$ ratio of 1.17. For higher growth rates of 3.0–4.0 microns per minute using trichlorosilane at 1150° C., thickness uniformities of ±2%–3% uniformity can be achieved with an $H_1/D_1$ ratio of 1.33.

On the other hand, the precise $H_1/D_1$ ratio for optimum uniformity is related to a degree upon the particular chemical reaction and temperature used to deposit the epitaxial silicon. Depending upon the precise chemical process selected for the deposition, the optimum $H_1/D_1$ ratio varies within the ranges given above.

Ratios at either end of the $H_1/D_1$ range of 1.10 to 1.40 are useful for processes having very slow (under 0.5 microns per minute) or very fast (above 4.0 microns per minute) deposition rates.

Thus, the geometry of the present invention permits a far more uniform deposition of epitaxial silicon upon the semiconductor wafer than possible with prior art reactors. This permits the far more simple and straightforward manufacturing process. Heretofore, as explained above, each particular semiconductor fabrication process required very precise control of inlet height relative to the susceptor, adjustment of the shape of the inlet, variation of the gas flow through the process enclosure and so forth. These complexities added to the "black magic" of semiconductor processing, which the present invention has substantially reduced.

Since the $H_1/D_1$ ratio is a very important factor upon uniformity of deposition, variation of the height of the enclosure 1 is desirable. This allows different rates of deposition to be performed with one reactor with optimum uniformity. The bell jar enclosure 1, typically made of quartz, is expensive so that a set of enclosures of varying heights may not be economically feasible. Height adjustment rings may be used with a single enclosure to raise the enclosure 1 until the desired $H_1/D_1$ ratio is attained. The rings (not shown) may be inserted between the enclosure 1 and the base plate 6.

Furthermore, the present invention also allows highly uniform doping concentrations in the deposited layer. As in prior art reactors, the present invention has the distance between the turns of the induction coil 2 and the susceptor 3 locally variable to permit closer spacing at the outer and inner edges of the susceptor 3 to compensate for greater radiative heat loss at these edges. The outer diameter of the coil cover 5 and coil 2 is also equal to or smaller than the outer diameter of the susceptor 3 in the prior art reactors. However, this technique is not entirely satisfactory in attaining a uniform temperature across the susceptor 3.

The present invention achieves highly uniform doping concentrations by setting the outer maximum dimension of the induction coil 2 to be slightly larger than the outer diameter of the susceptor. This provides more power to the outer edge of the susceptor 3 to compensate for the radiative heat loss there. The inner minimum dimension of the induction coil is also made slightly smaller than the inner diameter of the susceptor to also compensate for radiative heat loss at the inner edge as well.

The outer dimension, or outermost turn, of the coil 2 exceeds the outer diameter of the susceptor 3 by 0.05 to 0.25 inches and the inner dimension, or innermost turn, of the spiral coil 2 is smaller than the inner diameter of the susceptor by 0.15 to 0.25 inches. The particular values for the best results are a function of the coil configuration and the distance between the turns of the coil 2 and the susceptor 3, which is in the order of one-half inch. These values are found by empirical data and adjustment of the coil 2 with respect to the susceptor 3. The uniformity in temperature across the susceptor 3 in the present invention permits a highly uniform dopant concentration in the deposited epitaxial layer.

By combining the two features of the present invention, thickness uniformities of ±0.5%–1.0% and resistivity uniformities of ±2%–3% can be achieved. This is a substantial improvement over the performance of prior art reactors.

Finally, the present invention permits a method of highly uniform epitaxial deposition. The desired rate of epitaxial deposition is determined, then the optimum $H_1/D_1$ ratio is selected. The gas flow rate now affects the deposition layer only to a small degree, as compared to the highly sensitive adjustments found in the prior art. This rate can be adjusted finely to attain the very optimum uniform deposition. Of course, if the $H_1/D_1$ is already set, then the range of deposition rates for optimum uniformity is also determined.

If integrated circuits are to be manufactured, epitaxial deposition rates of 0.5 to 1.5 microns per minute are selected. Optimum uniformity requires an $H_1/D_1$ ratio of 1.15 to 1.20, or more specifically, 1.16 to 1.18. For processes requiring faster deposition rates from 1.5 to 3.0 microns per minute, an $H_1/D_1$ ratio of 1.20 to 1.30 is best. For thick epitaxial layers such as found in power semiconductor devices, faster deposition rates of 3.0 to 4.0 microns per minute are selected. An $H_1/D_1$ ratio of 1.30 to 1.37 should therefore be selected.

While the present invention has been discussed with respect to epitaxial silicon deposition, it can also be applied to other chemical vapor deposition processes as well, such as for silicon dioxide, silicon nitride, thin (less than one micron thick) and thick (approximately 500 microns) polycrystalline silicon.

The present invention is useful for deposition processes which are performed at higher temperatures where the deposition rate is controlled by the rate of arrival of the reacting gas species, rather than the surface reaction rate, which has a much stronger variation with temperature.

Thus, while the invention has been particularly shown and described with reference to the preferred embodiments, it is understood by those skilled in the art that changes in form and details may be made therein without departing from the spirit of this invention. It is therefore intended that an exclusive right be granted to the invention as limited only by metes and bounds of the appendant claims.

What is claimed is:

1. A bell jar enclosure and a susceptor for a chemical vapor deposition reactor, said susceptor arranged perpendicularly to a center line of said bell jar enclosure, and said enclosure and susceptor having a $H_1/D_1$ ratio in the range of 1.10–1.40 where $H_1$ is the height of said enclosure above said susceptor and $D_1$ is the diameter of said susceptor.

2. The bell jar enclosure and susceptor of claim 1 wherein the height $H_1$ of said enclosure is such that $H_1/D_1$ is in the range of 1.15 to 1.20 for the chemical vapor deposition of epitaxial silicon at a rate of 0.5 to 1.5 microns per minute.

3. The bell jar enclosure and susceptor of claim 2 wherein the height $H_1$ of said enclosure is such that is in the range of 1.16 to 1.18.

4. The bell jar enclosure and susceptor of claim 1 wherein the height $H_1$ of said enclosure is such that $H_1/D_1$ is in the range of 1.20 to 1.30 for the chemical vapor deposition of epitaxial silicon at a rate of 1.5 to 3.0 microns per minute.

5. The bell jar enclosure and susceptor of claim 1 wherein the height $H_1$ of said enclosure is such that $H_1/D_1$ is in the range of 1.30 to 1.37 for the chemical vapor deposition of epitaxial silicon at a rate of 3.0 to 4.0 microns per minute.

6. The bell jar enclosure and susceptor of claim 1 wherein the height $H_1$ of said enclosure is such that $H_1/D_1$ is in the range of 1.10 to 1.15 for the chemical vapor deposition of epitaxial silicon at a rate of less than 0.5 microns per minute.

7. The bell jar enclosure and susceptor of claim 1 wherein the height $H_1$ of said enclosure is such that $H_1/D_1$ is in the range of 1.37 to 1.40 for the chemical vapor deposition of epitaxial silicon at a rate of more than 4.0 microns per minute.

8. A chemical vapor deposition reactor comprising:
a base plate;
a disk-shaped susceptor for holding substrates, said susceptor being above said base plate and being rotatable around a central axis;
an induction heating coil in close proximity and below said susceptor for heating said susceptor; and
a bell jar enclosure positioned so to form a sealed volume with said base plate about said susceptor and the substrates, said bell jar enclosure having a central axis aligned with said susceptor central axis and having a height above said susceptor such that the ratio of said height to an outside diameter of said susceptor is in the range of 1.10 to 1.40.

9. The reactor of claim 8 wherein the height $H_1$ of said enclosure is such that $H_1/D_1$ is in the range of 1.15 to 1.20 for the deposition of epitaxial silicon at a rate of 0.5 to 1.5 microns per minute.

10. The reactor of claim 9 wherein the height $H_1$ of said enclosure is such that $H_1/D_1$ is in the range of 1.16 to 1.18.

11. The reactor of claim 8 wherein the height $H_1$ of said enclosure is such that $H_1/D_1$ is in the range of 1.20 to 1.30 for the epitaxial silicon at a rate of 1.5 to 3.0 microns per minute.

12. The reactor of claim 8 wherein the height $H_1$ of said enclosure is such that $H_1/D_1$ is in the range of 1.30 to 1.37 for the deposition of epitaxial silicon at a rate of 3.0 to 4.0 microns per minute.

13. The reactor of claim 8 wherein said bell jar enclosure is substantially a right circular cylinder capped by a half-sphere having the said radius as the right circular cylinder.

14. The reactor of claim 13 further comprising:
inlet means for introducing process gases into said sealed volume, said inlet means aligned along said center axis of said susceptor, and
outlet means for removing process gases from said sealed volume, said oulet means located through said base plate near said bell jar enclosure.

* * * * *